United States Patent [19]

May

[11] Patent Number: 5,187,449
[45] Date of Patent: Feb. 16, 1993

[54] COPLANAR TRANSMISSION LINE MILLIMETER RADIATION SOURCE

[75] Inventor: Paul G. May, New York, N.Y.

[73] Assignee: IBM Corporation, Armonk, N.Y.

[21] Appl. No.: 831,961

[22] Filed: Feb. 6, 1992

Related U.S. Application Data

[63] Continuation-in-part of Ser. No. 451,339, Dec. 15, 1989, abandoned.

[51] Int. Cl.$^5$ .................. H03B 11/04; H03B 11/10; H03K 3/42
[52] U.S. Cl. .................. 331/66; 250/214.1; 307/311; 331/99; 331/107 SL; 331/165; 333/220; 343/700 MS
[58] Field of Search ............ 331/66, 96, 99, 107 SL, 331/165, 166; 343/700 MS; 307/311; 250/211 J; 333/220, 238, 246, 247

[56] References Cited

U.S. PATENT DOCUMENTS 4,922,091  5/1990  Grischkowsky ............ 250/211 J

OTHER PUBLICATIONS

Grischkowsky et al., "Electromagnetic Shock Waves from Transmission Lines," Physical Review Letters, vol. 59, No. 15, 12 Oct. 1987, pp. 1663–1666.
Ketchen et al., "Generation of Subpicosecond Electrical Pulses on Coplanar Transmission Lines," Applied Physics Letters 48 (12), 24 Mar. 1986, pp. 751–753.
IBM Technical Disclosure Bulletin, vol. 31, No. 12, pp. 392–393, 399–400, May 1989.
Rutledge et al., "Integrated-Circuit Antennas" in Infrared and Millimeter Waves, vol. 10, Chap. 1, Academic Press 1983.

*Primary Examiner*—Siegfried H. Grimm
*Attorney, Agent, or Firm*—Sughrue, Mion, Zinn, Macpeak & Seas

[57] ABSTRACT

A structure for guiding millimeter wave radiation employs a resonant coplanar transmission line on a transparent substrate. A very short, picosecond, pulse is generated on the transmission line. By having the upper half plane air, the pulse will radiate into the substrate and be guided as millimeter wave from a distributed source and formed as a point source of radiation.

9 Claims, 1 Drawing Sheet

COPLANAR TRANSMISSION LINE MILLIMETER RADIATION SOURCE

This is a Continuation-in-Part of application Ser. No. 07/451,339 filed Dec. 15, 1989 and now abandoned.

BACKGROUND OF THE INVENTION

1. Field of the Invention

This invention relates to generation of millimeter radiation. In particular the invention pertains to an integrated millimeter radiation source and waveguide.

Many uses of microwave radiation, such as collision-avoidance radars, have large volume markets that require low cost components. One approach to satisfy these requirements is based on integrated circuit antennas. These antennas radiate primarily into the substrate and a problem often encountered is loss of energy to surface waves, resulting in a loss of antenna efficiency.

This invention involves a unique geometry of the substrate such that as much of the energy as possible is coupled to surface waves—i.e., the energy is waveguided and then emitted at an aperture. This approach is particularly appropriate for a distributed antenna based on transmission lines (e.g., coplanar transmission lines).

2. Description of the Prior Art

Reference is made to *Infrared and Millimeter waves*, vol. 10 chap. 1, "Integrated—Circuit Antennas", Rutledge et al., Academic Press, 1983. This reference describes various configurations used for making integrated circuit antenna. It also discusses some of the limitations to antenna efficiency, including energy lost as surface waves.

Grischkowsky et al., "Electromagnetic Shock Waves from Transmission Lines", Phys. Rev. Lett. 59, 1663 (1987) describes a particular coplanar transmission configuration where pulses on Aluminum lines deposited on a Silicon Sapphire (SOS) substrate radiate into the substrate at an efficiency dependent on the characteristic frequency.

Reference is made to M. B. Ketchen, et al., "Generation of Subpicosecond Electrical Pulses on Coplanar Transmission Lines", Appl. Phy. Lett. 48 (12), Mar. 24, 1986, pp.751-753. This publication describes techniques to generate ultrashort electrical pulses by photoconductively shorting charged transmission lines across narrow gaps.

The generation of fast electrical pulses utilizing photoconductive resonant cavities has also been proposed in the literature. Reference is made to IBM Technical Disclosure Bulletin Volume 31, No. 12 pp. 392-393, May 1989. This publication discloses the use of a photoconductive resonant cavity in which the cavity length is matched to the repetition rate of the excitation optical source, such as a semiconductor diode. The resonant cavity is defined by having impedance discontinuities in the transmission line and is selected so that the round trip time of an electrical pulse is equal to the period of laser oscillations or a multiple thereof. The discontinuity presents 100% mirror at one end of the cavity. Thus, the internal pulse amplitude within the cavity is significantly larger than in a non-resonant cavity. The resonant cavity formed in this publication is an electrical analog of a Fabry-Perot.

Thus, while the art provides alternative concepts for the generation and guiding of millimeter waves, a need still exists in the art to define more efficient techniques of guiding radiation from a distributed microwave emitter, such as a transmission line, such that all of the radiation is emitted as a point source. That is, the waveguide should be used whose ends can act as a point source.

SUMMARY OF THE INVENTION

It is an object of this invention to have a system which provides an efficient point source of millimeter radiation.

It is a further object of this invention to provide a technique to guide millimeter radiation from a distributed source such that a point source of radiation is formed.

Yet another object of this invention is to define a transmission structure that operates on a variety of input radiation pulses such as those photoconductively or electrically generated to guide such in an efficient manner.

These and other objects of the invention are accomplished by employing a coplanar transmission line structure to generate millimeter wavelength radiation into a substrate. Short pulses traveling on a transmission line with the upper half plane being air radiate into the substrate. The ratio of the velocity of the electrical pulses, with respect to the phase velocity of the radiation in the substrate, defines the angle of emission. Thus, by suitable choice of material for the substrate and its thickness, a guided wave can be produced.

By the use of a photoconductive transmission line structure electrical pulses are generated on the transmission line without loading problems, by exciting the line with a short pulse from a laser.

For a more compact millimeter waveguide source a resonant photoconductive transmission line is used, which for a given transmission line length is more efficient. This resonant cavity is excited by the high frequency sinusoidal output from a semiconductor layer.

This invention will be described in greater detail by referring to the attached drawing and a description of the preferred embodiment which follows.

DESCRIPTION OF THE PREFERRED EMBODIMENT

In the preferred embodiment, a light pulse incident on a photoconductive gap produces an electrical pulse. The electrical pulse produced will travel along the transmission line and radiate millimeter waves. These waves are guided by the substrate structure and emitted at the end of the waveguide. Beam dimensions of light should be matched to the gap between lines that form the transmission line (for fast pulses, i.e., less than 20 ps, gaps should be 1-50 microns and beam dimension matched accordingly). Wavelengths should be above the bandgap of silicon so that corners are created. An optimum wavelength $\lambda$ would be such that all light is absorbed over the thickness of polysilicon. At wavelengths $\lambda$ equal to 600 nm this is approximately 1 micron, at wavelengths $\lambda$ equal to 800 nm, this is approximately 10 microns. Pulse length determines electrical pulse length and consequently the frequency make-up of the radiated waves. The higher the frequency components in the electrical pulse, the more efficient the millimeter wave radiation (and the higher its frequency components are). Relevant equations are set forth in the Grischkowsky reference.

Larger pulse amplitudes provide larger electrical pulses, which give more millimeter radiation. The repetition rate of light pulses is also important for resonant operation.

In a second embodiment, which will be described in detail below, the electrical pulse can be directly produced by using a fast electrical device, (e.g., an IMPATT diode).

Figure 1:
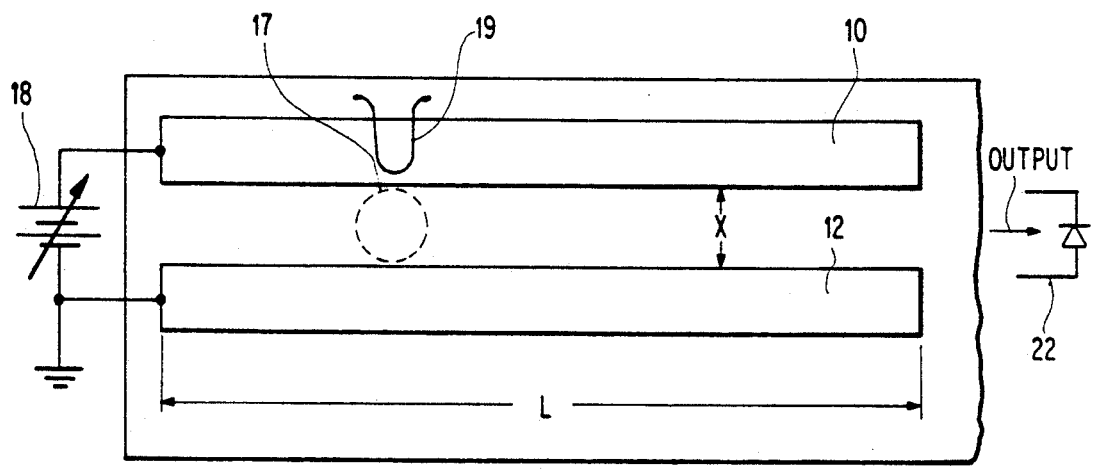
FIG. 1 is a top view of the structure produce picosecond electrical pulses on a transmission line.
Figure 2:
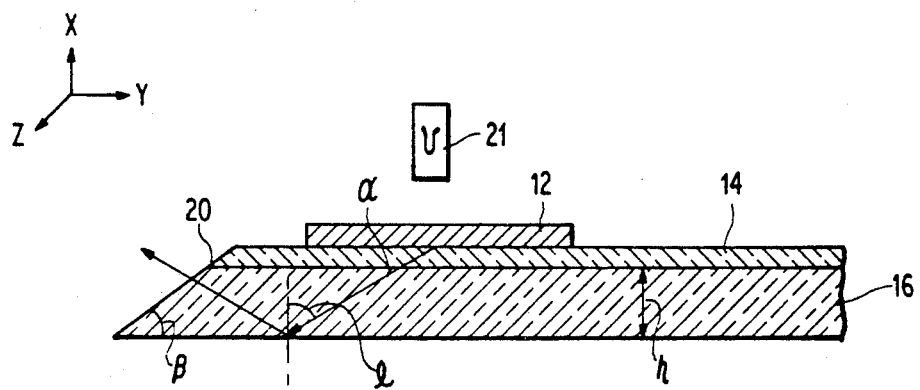
FIG. 2 is a side view of the system of FIG. 1 illustrating the transmission through the substrate, and direction of the output.

Referring now to FIGS. 1 and 2, a preferred embodiment of this invention will be depicted. A pair of metal lines 10 and 12, are formed on the surface of a damaged polycrystalline structure 14. That is, a structure of ion implanted polysilicon. This layer is placed on top of a suitable substrate 16 such as sapphire. The transmission lines 10 and 12 are suitably biased by means of a direct current power supply 18. Typically, they are biased in the range of 5–10 volts. The transmission lines 10 and 12 are given a critical length L (to achieve resonance) and are separated from each other by a distance "x". The critical length L is the length of the cavity required to achieve resonance; resonance being achieved when the roundtrip time of an electrical pulse equals the period of the laser oscillations. In other words, the critical length L of the transmission lines 10 and 12 match the repetition rate of an exciting optical source, for example, a laser pulse 19 produced by a laser 21 as shown in FIGS. 1 and 2. The IBM Technical Disclosure Bulletin, Vol. 31, No. 12, pp. 392, 393, 399, and 400, May 1989, to the extent necessary to describe the meaning and usage of the terms critical length or cavity length and resonance, is incorporated herein by reference. The distance x is chosen so that a diode spot 17 can be focused between the lines 10 and 12.

The diode spot 17 is produced from a laser pulse 19 that propagates from preferably a GaAS/AlGaAs semi conductor laser 21. It will be apparent to those of working skill that other lasers may be used. The diode spot 17 causes fast electrical pulses to travel down the transmission lines which radiates millimeter waves. This technique, that is generating electrical pulses from a diode spot which is itself generated by an optical source, has become a standard technique used in this art, as exemplified by Grischkowsky et al., "Electromagnetic Shock Waves from Transmission Lines," Phys. Rev. Lett. 59, 1663 (1987), which is incorporated herein by reference for all that it teaches.

Any high frequency pulse, such as that caused by the diode spot, travelling on a transmission line will emit radiation, which is a fundamental principal of antenna theory. For a particular transmission line geometry, the efficiency of the radiation emitted depends on the frequency components of the electrical pulse (the efficiency for a particular frequency f depends on frequency cubed or $f^3$). Radiation will also be preferentially emitted for wavelengths close to the separation of the lines.

In accordance with a second embodiment of the present invention, the high speed electrical pulse on the transmission line can be created by a high speed switching device 22 (e.g., a high speed diode such as an IMPATT device) connected directly to the transmission line, or in the case where the two conductors of the transmission line are in coplanar geometry and are separated by a photoconductive material such as polysilicon, the electrical pulse can be generated by transiently shorting the lines through incidence of a light pulse. In this instance, the electrical pulse generated has the same duration as the light pulse.

A high frequency diode 22 is connected to a coplanar transmission line by connecting (through a metal interconnect) one terminal of the diode to one conductor, and the other terminal to the other conductor.

By the use of a resonant transmission line structure, due to the higher intracavity fields, higher yields of millimeter radiation at a particular wavelength and for a particular transmission line length can be produced. The ratio of the velocity of the electrical pulses relative to the phase velocity of the radiation in the substrate defines the angle of emission.

By suitable choice of substrate material and thickness, a guided wave can be produced. For air as the upper half plane dielectric then guiding will always occur irrespective of substrate material as long as it is transparent. In this situation, the ratio of the angle of incidence at the lower substrate/air interface ($\beta$) to the critical angle (Y) is given by (quasistatic approximation) $\sin 1/\sin y = (\frac{1}{2}(\epsilon + 1))^{\wedge} \frac{1}{2}$, which always gives $1 > Y$ (i.e., guiding).

For example, the substrate could be quartz where the dielectric constant $\epsilon$ is approximately 4. The critical angle is about 30°. For silicon having a dielectric constant $\epsilon$ of approximately 11, the critical angle would be about 20°.

For instance, if the transmission lines 10 and 12 are placed on a damaged silicon on sapphire substrate (SOS) then using $v = c/2.45$ on the line and $v = c/3.3$ for high frequency radiation in the substrate, the angle of the emission is approximately 50°, wherein v is the group velocity of the pulse on the line, and the millimeter wave pulse in the substrate, respectively, and c is the speed of light in free space. This is compatible with guided radiation in the sapphire where the critical angle to air is approximately 20°.

For a cavity having a length L of 3 mm, resonance would occur with an excitation of 40 GHz. As determined from the equations found in Rutledge et al., "Integrated-Circuit Antennas" incorporated herein by reference, the amplitude absorption coefficient due to radiation is approximately $0.4 \times 10^{-4}$ m$^{-1}$ at 40 GHz. For a bias voltage in the range of 10 V on 100 Ω lines, the radiation power at 0.75 mm wavelength is in the range of 10 mw. For lines of separation of 200 um then the radiation is in the range of 250 mw.

Referring now to FIG. 2, the structure of FIG. 2 is depicted illustrating those emission angles. An emission cone of millimeter radiation having an angle 1 of approximately 50° is created when a diode spot is projected on the damaged poly layer 14 causing resonance. This is compatible with guided radiation in the sapphire 16 where the critical angle is approximately 20°. For angles greater then the critical angle of 20° there is total internal reflection. The output face 20 of the waveguide is angled as shown so that the millimeter radiation outputs normal to this face. The thickness, h, of the substrate should be in the order of the wavelength of radiation (here approximately 1 mm).

A sapphire substrate of approximately 0.5 mm in thickness is suitable with the damaged poly layer of approximately 1$\mu$ forming the SOS composite. For better confinement, the wafer should be cleaved in a slab geometry having a width of a few mm (i.e., confinement in the x and z directions as defined by FIG. 2).

Higher efficiencies can also be achieved at higher frequencies (frequency cubed dependence) in which case one would use shorter pulses with components of several hundred GHz. The bandwidth of radiation will be larger though strongly peaked toward the shorter wavelengths, with the shortest emitted wavelength at a few hundred microns.

This invention can thus be summarized as follows:

I. Coplanar Transmission line on waveguide substrate (pulses can be launched on line by any means e.g., high frequency gunn diode, IMPATT diode or the like, or by depositing lines on damaged polysilicon such that short pulses can be generated photoconductively directly on the lines);

II. any transparent substrate;

III. shaped output face of waveguide;

IV. width of transmission line and pulse frequency determines efficiency of millimeter radiation of a particular wavelength at the output face of the waveguide.

It is apparent that modifications of this invention may be practiced without departing from the essential scope thereof.

Having defined my invention, I claim:

1. A system for generating millimeter wave radiation comprising:
 a substrate having a thickness approximately equal to the millimeter wave radiation wavelength,
 a coplanar transmission line on said substrate, and
 means to produce short pulses on said transmission line which radiate into said substrate.

2. The system of claim 1 wherein said substrate is Sapphire.

3. The system of claim 1 wherein said substrate has a thickness of approximately equal to the radiation wavelength.

4. The system of claim 3 wherein said coplanar transmission line is connected across a high frequency device.

5. The system of claim 3 wherein said transmission line is deposited on polycrystalline silicon and, said means to produce short pulses generates electrical pulses which are produced on said transmission line by impingement of short optical laser pulses where a wavelength of said laser pulses $\lambda$ is less than 1 micron.

6. The system of claim 3 wherein said transmission line is deposited on polycrystalline silicon and whose length is such that a semiconductor laser with a particular modulation frequency will produce a wave on the transmission line so that round trip time of electrical pulse is equal to repetition rate of laser modulation.

7. The system of claim 3 further comprising means to bias said transmission line.

8. The system of claim 4 wherein said high frequency device is an IMPATT diode.

9. The system of claim 7 wherein said transmission line is deposited on polycrystalline silicon and, said means to produce short pulses generates electrical pulses which are produced on said transmission line by impingement of short optical laser pulses where a wavelength of said laser pulses $\lambda$ is less than 1 micron.

* * * * *